US012757548B2

(12) United States Patent
Chen

(10) Patent No.: US 12,757,548 B2
(45) Date of Patent: Oct. 6, 2026

(54) ARRAY SUBSTRATES AND DISPLAY PANELS

(71) Applicant: Wuhan China Star Optoelectronics Semiconductor Display Technology Co., Ltd., Wuhan (CN)

(72) Inventor: Bi Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 386 days.

(21) Appl. No.: 18/381,185

(22) Filed: Oct. 18, 2023

(65) Prior Publication Data

US 2024/0266488 A1 Aug. 8, 2024

(30) Foreign Application Priority Data

Feb. 6, 2023 (CN) ......................... 202310099715.6

(51) Int. Cl.

| | |
|---|---|
| ***H10H 20/857*** | (2025.01) |
| ***G06F 3/041*** | (2006.01) |
| ***G06F 3/044*** | (2006.01) |
| ***H10H 20/831*** | (2025.01) |
| ***H10H 29/14*** | (2025.01) |
| ***H10W 90/00*** | (2026.01) |

(52) U.S. Cl.

CPC ......... *H10H 20/857* (2025.01); *G06F 3/0412* (2013.01); *G06F 3/0443* (2019.05); *H10H 20/831* (2025.01); *H10H 29/142* (2025.01); *H10W 90/00* (2026.01)

(58) Field of Classification Search

CPC .. H10H 20/857; H10H 20/831; H10H 29/142; G06F 3/0412; G06F 3/0443; G06F 2203/04103; H01L 25/0753; G02F 1/1362; G02F 1/13338; G02F 1/134309

See application file for complete search history.

(56) References Cited

U.S. PATENT DOCUMENTS

| | | | | |
|---|---|---|---|---|
| 2015/0331508 | A1* | 11/2015 | Nho | G06F 3/0443 345/173 |
| 2017/0220150 | A1* | 8/2017 | Wu | H10K 59/80515 |
| 2018/0143729 | A1* | 5/2018 | Lee | G06F 3/0416 |
| 2019/0012022 | A1* | 1/2019 | Ye | G06F 3/04164 |
| 2019/0056829 | A1* | 2/2019 | Ye | H10K 59/40 |
| 2019/0181206 | A1* | 6/2019 | Cao | H10K 59/1213 |
| 2019/0386069 | A1* | 12/2019 | Feng | H10K 50/82 |
| 2021/0294445 | A1* | 9/2021 | Du | H10K 59/8052 |
| 2022/0214758 | A1* | 7/2022 | Cheng | G06F 3/042 |
| 2022/0309823 | A1* | 9/2022 | Li | G06F 3/04164 |
| 2023/0026941 | A1* | 1/2023 | Lv | H10K 59/80521 |
| 2024/0224660 | A1* | 7/2024 | Kim | H10K 59/40 |

* cited by examiner

*Primary Examiner* — Bitew A Dinke

(57) ABSTRACT

Array substrates and display panels are provided. The array substrate includes a base, an intermediate layer, and a cathode layer. The intermediate layer is disposed on the base and includes a plurality of pixel units. The cathode layer is disposed on a side of the intermediate layer away from the base and includes touch electrodes and cathodes corresponding to the pixel units. A vertical orthographic projection of each of the cathodes on the base covers vertical orthographic projections of two of the pixel units on the base, and each of the touch electrodes surrounds and spaced apart from one of the cathodes.

14 Claims, 6 Drawing Sheets

ARRAY SUBSTRATES AND DISPLAY PANELS

CROSS-REFERENCE TO RELATED APPLICATION

This application claims the benefit of priority of Chinese Patent Application No. 202310099715.6, filed on Feb. 6, 2023, the contents of which are incorporated by reference as if fully set forth herein in their entirety.

TECHNICAL FIELD

The present disclosure relates to the field of display technologies, and in particular, to array substrates and display panels.

BACKGROUND

With the rapid development of display technology, touch screens have gradually spread in people's lives. Currently, commonly used touch technologies include add-on touch technology and display touch integration technology. The mainstream touch technology adopted at this stage is to make touch electrodes on an encapsulation layer (on-cell), which may increase a number of masks in a manufacturing process, increase a thickness of a touch screen, and thus increase the production costs. An in-cell touch screen embeds the touch electrodes inside a liquid crystal display panel, which may reduce an overall thickness of the module and greatly reduce the production costs of the touch screen.

At present, an existing capacitive in-cell touch screen is realized by directly adding touch scanning lines and touch sensing lines on an existing array substrate, that is, two layers of strip electrodes intersecting each other on different planes are arranged on a surface of the array substrate. These two layers of electrodes are respectively used as the touch driving lines and touch sensing lines of the touch screen, and mutual capacitances are formed at intersections of the two electrodes on different planes. However, this design makes display signals and touch signals interfere with each other, affecting quality of display images and touch precision.

Therefore, how to avoid mutual interference between the display signals and the touch signals, and improve the quality of the display images and the touch precision is an urgent problem to be solved.

SUMMARY

In view of above, array substrates are provided according to embodiments of the present disclosure. The array substrate includes a base, an intermediate layer, and a cathode layer. The intermediate layer is disposed on the base and includes a plurality of pixel units. The cathode layer is disposed on a side of the intermediate layer away from the base and includes touch electrodes and cathodes corresponding to the pixel units. A vertical orthographic projection of each of the cathodes on the base covers vertical orthographic projections of two of the pixel units on the base, and each of the touch electrodes surrounds and spaced apart from one of the cathodes.

Display panels are further provided according to embodiments of the present disclosure. The display panel includes the above-mentioned array substrate.

BRIEF DESCRIPTION OF THE DRAWINGS

In order to more clearly illustrate the technical solutions In the embodiment of the present disclosure, the drawings that need to be used in the description of the embodiments will be briefly introduced below. Obviously, the drawings in the following description are only some embodiments of the present disclosure. For those skilled in the art, other drawings may also be obtained based on these drawings without any creative effort.

DETAILED DESCRIPTION

Technical Solutions

Figure 1:
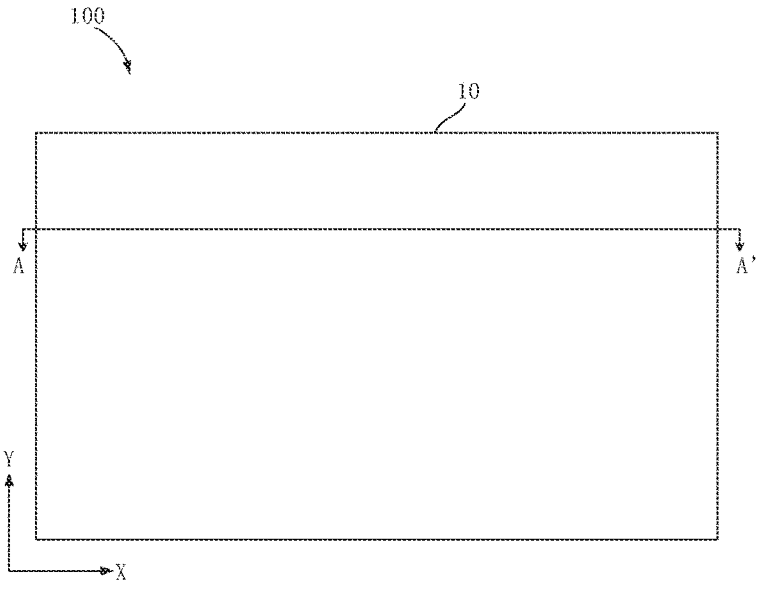
FIG. 1 is a schematic structural diagram of an array substrate provided in an embodiment of the present disclosure.

In the embodiment of the present disclosure will be clearly and completely described below with reference to the accompanying drawings. Obviously, the described embodiments are only some of the embodiments of the present disclosure, not all of them. Based on the embodiments in the present disclosure, all other embodiments obtained by those skilled in the art without making creative efforts belong to the protection scope of the present disclosure.

Embodiments of the present disclosure provide array substrates and display panels, which may avoid mutual interference between display signals and touch signals, and improve the quality of display images and the touch precision. The array substrates and the display panels will be described in detail below. It should be noted that the description sequence of the following embodiments is not intended to limit the preferred sequence of the embodiments. In addition, in the description of the present disclosure, the term "including" means "including but not limited to". The terms "first", "second", "third" and so on are only used as labels, which are used to distinguish different objects, rather than to describe a specific order.

Referring to FIG. 1 to FIG. 5, array substrates 100 are provided in the first embodiment of the present disclosure. The array substrate 100 includes a base 10, an intermediate layer 20, and a cathode layer 30. The intermediate layer 20 is arranged on the base 10 and includes a plurality of pixel units 21. The cathode layer 30 is arranged on a side of the intermediate layer 20 away from the base 10 and includes cathodes 31 and touch electrodes 32. The cathodes 31 are arranged corresponding to the pixel units 21, and a vertical orthographic projection of the cathode 31 on the base 10 covers vertical orthographic projections of at least two pixel units 21 on the base 10. The touch electrode 32 surrounds the cathode 31 and is spaced apart from the cathode 31.

In the array substrates of the present disclosure, the cathodes 31 and the touch electrodes 32 are arranged in a same layer, i.e. the cathode layer 30, which may avoid mutual interference between display signals and touch signals, and at the same time, reduce a parasitic capacitance between the touch electrode 32 and a display signal line (not shown in the figures), and improve the quality of the display images and the touch precision.

In the embodiment of the present disclosure, the intermediate layer 20 includes a semiconductor layer, a gate insulation layer, a gate layer, an interlayer insulation layer, a source-drain layer, a passivation layer, a planarization layer, an anode layer 211, a pixel definition layer 40, and a light-emitting layer 212 arranged in sequence along a direction away from base 10. The pixel definition layer 40 includes a plurality of pixel openings 41 corresponding to the anode layer 211. The light-emitting layer 212 is arranged in the pixel openings 41. The cathode layer 30 is arranged on the pixel definition layer 40 and the light-emitting layer 212, the cathodes 31 cover the light-emitting layer 212, and the touch electrode 32 surrounds the cathode 31 and is spaced apart from the cathode 31.

In the embodiment of the present disclosure, each of the pixel units 21 include a first light-emitting unit 21*a*, a second light-emitting unit 21*b*, and a third light-emitting unit 21*c*. The first light-emitting unit 21*a* and the second light-emitting unit 21*b* are adjacently arranged along a first direction X, the first light-emitting unit 21*a* and the second light-emitting unit 21*b* are both arranged adjacent to the third light-emitting unit 21*c* along a second direction Y, and the first direction X crosses the second direction Y. A vertical orthographic projection of the cathode 31 on the base 10 covers vertical orthographic projections of two adjacent pixel units 21 arranged along the first direction X on the base 10. The first light-emitting unit 21*a* is a red light-emitting unit or a green light-emitting unit, correspondingly, the second light-emitting unit 21*b* is a green light-emitting unit or a red light-emitting unit, and the third light-emitting unit 21*c* is a blue light-emitting unit. An area of the blue light-emitting unit is about twice that of the red light-emitting unit (or the green light-emitting unit), so that adjacent red light-emitting unit and green light-emitting unit may share one blue light-emitting unit.

As illustrated in FIG. 1, the first direction X is a width direction of the display panel, and the second direction Y is a length direction of the display panel. Preferably, the first direction X and the second direction Y are perpendicular to each other. Furthermore, the first direction X may also be the length direction of the display panel, and the second direction Y is the width direction of the display panel.

Figure 2:
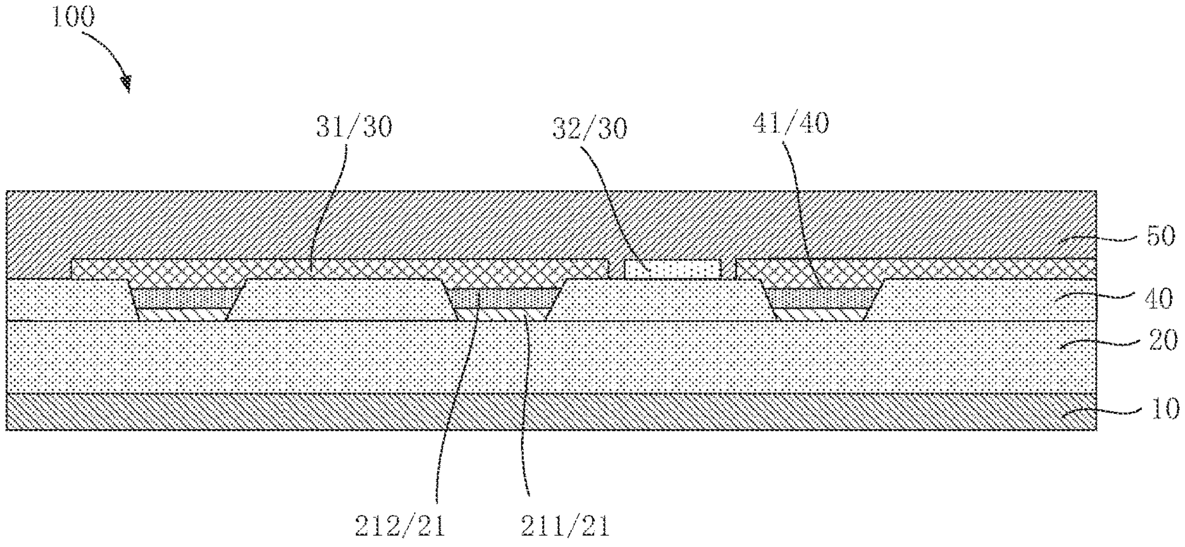
FIG. 2 is a sectional view of the array substrate provided in FIG. 1 along A direction AA'.

In the embodiment of the present disclosure, as illustrated in FIG. 2, the pixel units 21 include the anode layer 211 and the light-emitting layer 212. The anode layer 211 is electrically connected to the source-drain layer (not shown in the figures) through via holes (not shown in the figures), and the light-emitting layer 212 is electrically connected to the cathodes 31. That is, vertical orthographic projections of the touch electrodes 32 on the base 10 do not overlap with orthographic projections of the anodes on the base 10. Such a design is beneficial to reduce the parasitic capacitance between the touch electrode 32 and the display signal line, and avoid mutual interference between the display signals and the touch signals, thereby improving the quality of the display images and the touch precision.

In the embodiment of the present disclosure, the array substrate 100 further includes an encapsulation layer 50 disposed on a side of the cathode layer 30 away from the base 10. Specifically, the encapsulation layer 50 includes a first inorganic layer, an organic layer, and a second inorganic layer arranged in sequence along a direction away from the base 10. The first inorganic layer and the second inorganic layer are both made of silicon oxide material or oxynitride material, and a high-molecular polymer or resin material is used for the organic layer.

Figure 3:
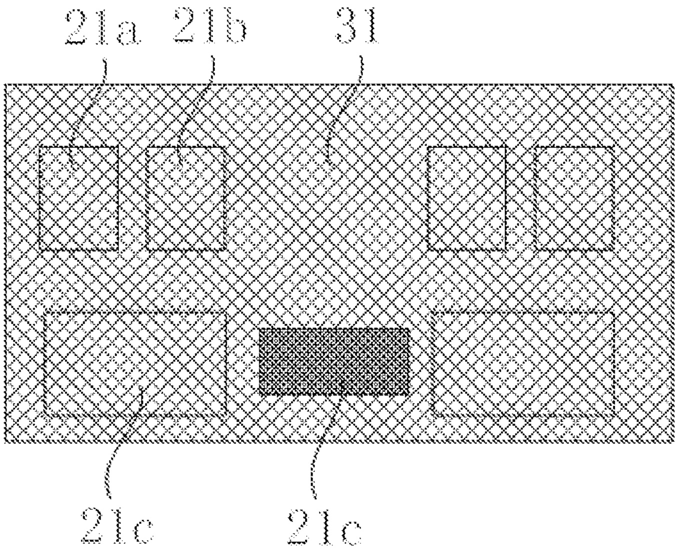
FIG. 3 is a first schematic top view of an array substrate provided in a first embodiment of the present disclosure.
Figure 4:
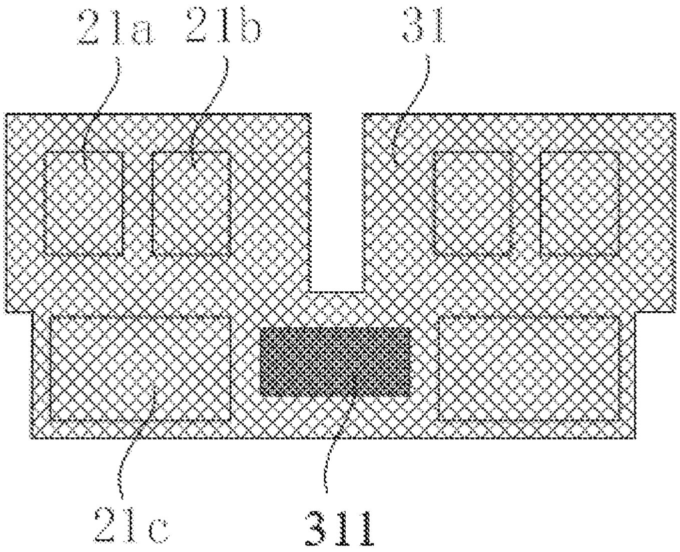
FIG. 4 is a second schematic top view of the array substrate provided in the first embodiment of the present disclosure.

In the embodiment of the present disclosure, as illustrated in FIG. 3, a cross-sectional shape of the cathode 31 may be a regular quadrilateral, such as a square, and such a design makes a cross-sectional area of the cathode 31 large, which may increase a conductivity of the cathode 31 and reduce the resistance of the cathode 31. Furthermore, the cross-sectional shape of the cathode 31 may also be an irregular polygon. For example, the cathode 31 illustrated in FIG. 4 covers the corresponding light-emitting units and covers a gap between the pixel units as little as possible. Such a design is beneficial to reduce the parasitic capacitance between the cathode 31 and other metal films, and increase the cross-sectional area of the touch electrode to improve the touch precision. It should be noted that the cross section refers to a section along a horizontal direction of the array substrate.

Figure 5:
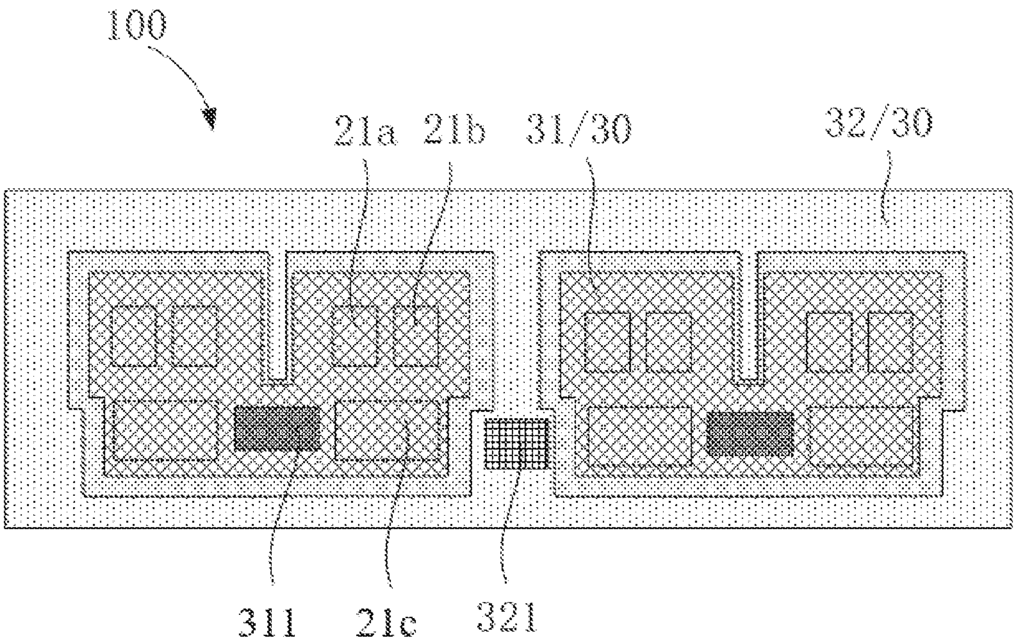
FIG. 5 is a third schematic top view of the array substrate provided in the first embodiment of the present disclosure.

In the embodiment of the present disclosure, as illustrated in FIG. 5, the cathode layer 30 further includes cathode bonding portions 311 and touch bonding portions 321. The cathode bonding portions 311 and the cathodes 31 are provided in one-to-one correspondence, and a vertical orthographic projection of the cathode bonding portion 311 on the base 10 is located between vertical orthographic projections of two adjacent third light-emitting units 21*c* on the base. The touch bonding portion 321 is disposed between two adjacent cathodes 31 arranged along the first direction X, and a vertical orthographic projection of the touch bonding portion 321 on the base 10 is located between vertical orthographic projections of two adjacent third light-emitting units 21*c* on the base. Each of the cathode bonding portions 311 and the touch bonding portions 321 is disposed between two adjacent third light-emitting units 21*c* arranged along the first direction X, and such a design is not only beneficial to avoid mutual interference between the touch signals and the display signals, but also to save layout space, making the display screen have more pixels per inch and improving display quality.

Furthermore, the cathode bonding portion 311 is disposed on the cathode 31, and the touch bonding portion 321 is disposed on the touch electrode 32. Specifically, the intermediate layer 20 further includes a metal wiring layer (not shown in the figure) arranged in a layer same as the gate layer and the source-drain layer, or same as the semiconductor layer and the insulation layer. The cathode 31 is electrically connected to the metal wiring layer through the cathode bonding portion 311, and one cathode bonding portion 311 may provide voltage for the cathode 31 of at least two pixel units 21.

In the embodiment of the present disclosure, the materials of the cathode 31 and the touch electrode 32 both include magnesium-silver alloy, which is used to increase the conductivity of the cathode 31 and the touch electrode 32 and reduce a thickness of the cathode layer 30.

Referring to FIG. 6 to FIG. 9, array substrates 200 are provided in the second embodiment of the present disclosure. The differences between the array substrate 200 and the array substrate 100 are that the cathode layer 30 further includes hollow portions 60 disposed between the cathodes 31 and the touch electrodes 32, and that at least some of the cathode bonding portions 311 are disposed on the hollow portions 60 and spaced apart from the touch electrodes 32, and/or at least some of the touch bonding portions 321 are disposed on the hollow portion 60 and spaced apart from the cathodes 31.

Figure 6:
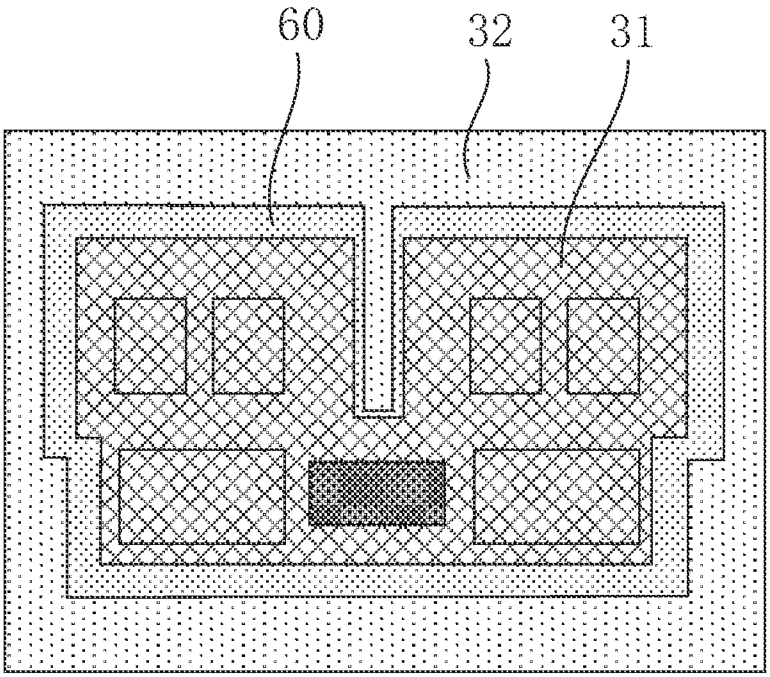
FIG. 6 is a first schematic top view of an array substrate provided in a second embodiment of the present disclosure.

In the embodiment of the present disclosure, as illustrated in FIG. 6, the hollow portion 60 is arranged around the cathode 31, and the touch electrode 32 is arranged around the hollow portion 60, that is, the hollow portion 60 is arranged between the cathode 31 and the touch electrode 32, so that the cathode 31 and the touch electrode 32 are spaced apart from each other, so as to avoid display abnormalities such as a short circuit caused by a short circuit between the cathode 31 and the touch electrode 32.

Figure 7:
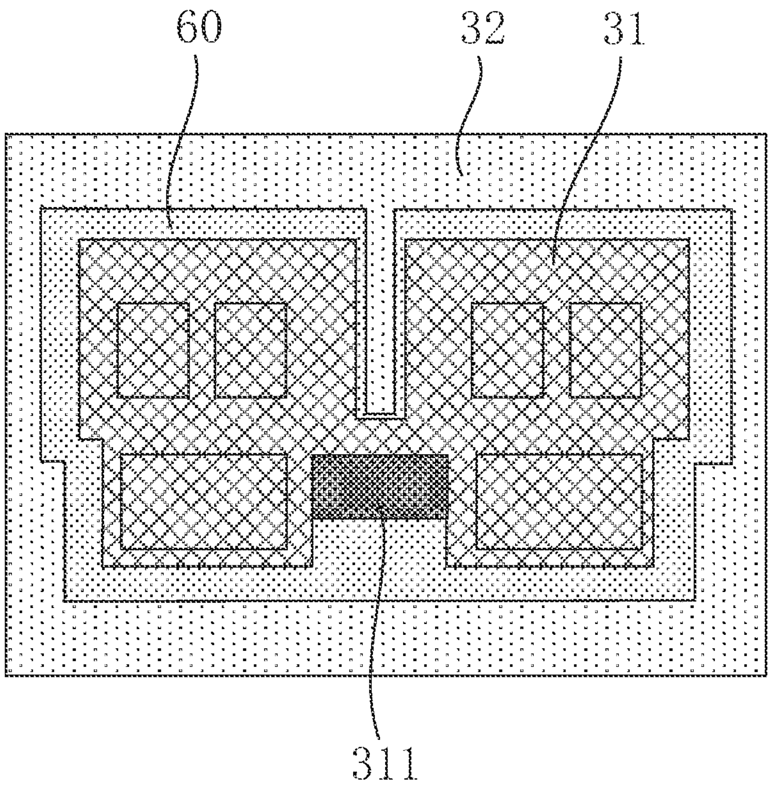
FIG. 7 is a second schematic top view of the array substrate provided in the second embodiment of the present disclosure.

In the embodiment of the present disclosure, as illustrated in FIG. 7, the cathode bonding portion 311 is disposed on the hollow portion 60, and a vertical orthographic projection of the hollow portion 60 on the base covers a vertical orthographic projection of the cathode bonding portion 311 on the base, which makes the cathode bonding portion 311 spaced apart from the touch electrode 32 to avoid display abnormalities such as a short circuit caused by a short circuit between the cathode 31 and the touch electrode 32.

Figure 8:
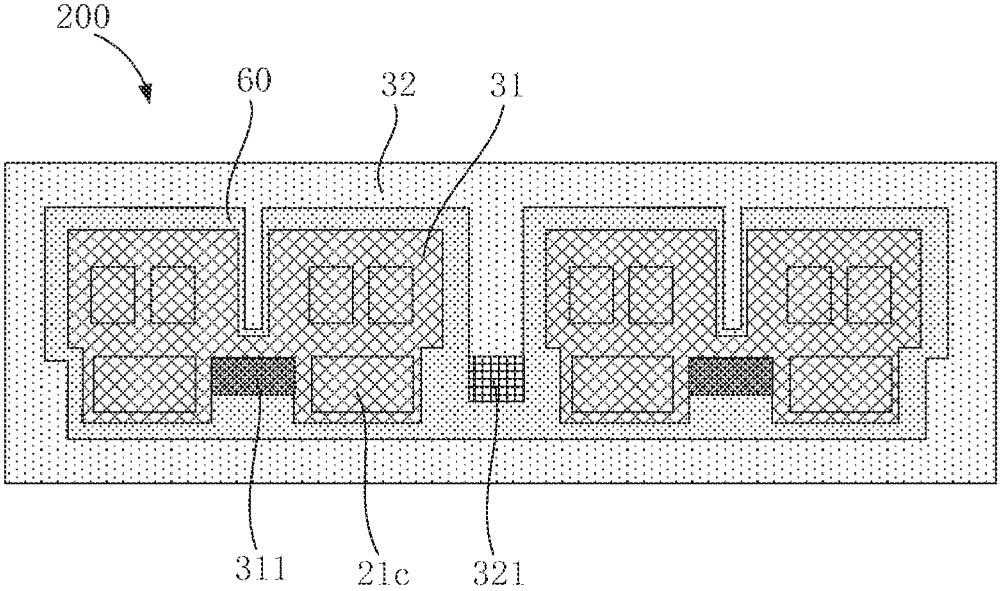
FIG. 8 is a third schematic top view of the array substrate provided in the second embodiment of the present disclosure.

In the embodiment of the present disclosure, as illustrated in FIG. 8, the cathode bonding portions 311 and the touch-control bonding portions 321 are all located on the hollow portion 60. The cathode bonding portions 311 and the cathodes 31 are provided in a one-to-one correspondence, and the cathode bonding portion 311 is correspondingly located between the two third light-emitting units 21*c* covered by the cathode 31. The touch bonding portion 321 is disposed between two cathodes 31 and between two third light-emitting units 21*c*. Such an arrangement ensures the conductivity of the cathode 31 and the touch electrode 32 while avoiding mutual interference between the display signals and the touch signals.

Figure 9:
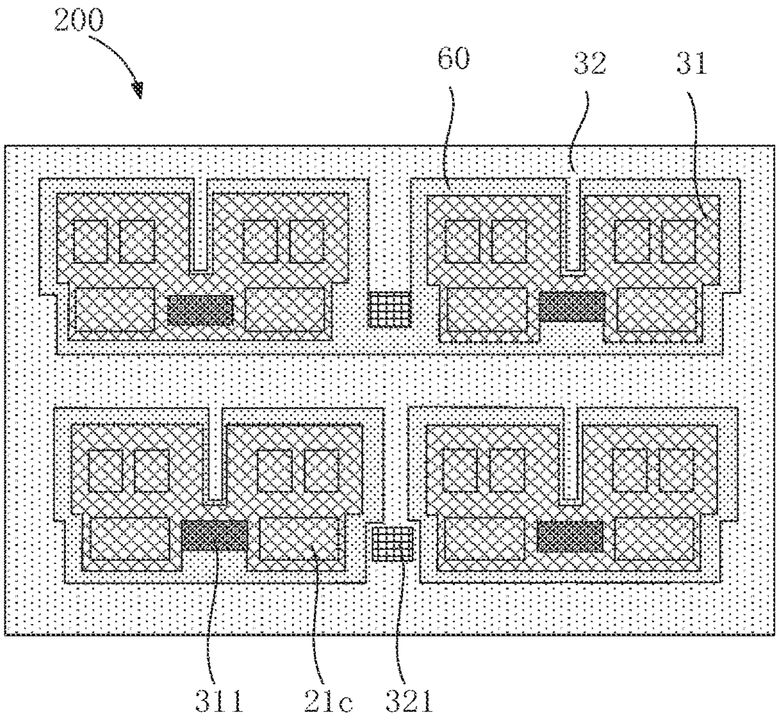
FIG. 9 is a fourth schematic top view of the array substrate provided in the second embodiment of the present disclosure.

In the embodiment of the present disclosure, as illustrated in FIG. 9, some of the cathode bonding portions 311 and some of the touch-control bonding portions 321 are located on the hollow portion 60, some of the cathode bonding portion 311 are located on the cathodes 31, and some of the touch-control bonding portions 321 are located on the touch electrodes 32. Of course, FIG. 9 is just an example. Specifically, the cathode bonding portion 311 may be entirely located on the cathode 31 or the hollow portion 60, and the touch bonding portion 321 may be entirely located on the touch electrode 32 or the hollow portion 60. It is only necessary to ensure that the cathode bonding portions 311 are arranged in one-to-one correspondence with the cathodes 31 and each is located between the two third light-emitting units 21*c* covered by the corresponding cathode 31, and to ensure that the touch bonding portion 321 is disposed between the two cathodes 31 and between the two third light-emitting units 21*c*, and is spaced apart from the touch bonding portion 321 to avoid the short circuit. Such an arrangement ensures the conductivity of the cathode 31 and the touch electrode 32 while avoiding mutual interference between the display signals and the touch signals, thereby improving the quality of the display images and the touch precision.

Figure 10:
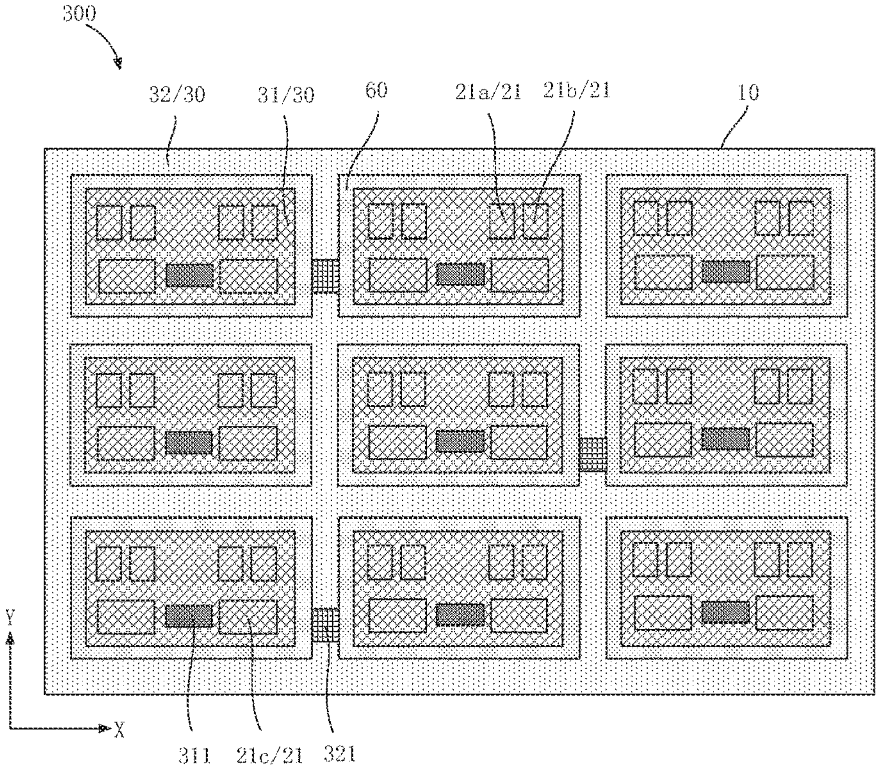
FIG. 10 is a schematic top view of an array substrate provided in a third embodiment of the present disclosure.

Referring to FIG. 10, an array substrate 300 is provided in the third embodiment of the present disclosure. The difference between the array substrate 300 and the array substrate 100 is that the cathode layer 30 includes the plurality of cathodes 31, and some of the cathodes 31 have no touch bonding portion 321 provided therebetween.

In the embodiment of the present disclosure, the pixel unit 21 includes a first light-emitting unit 21*a*, a second light-emitting unit 21*b*, and a third light-emitting unit 21*c*. the first light-emitting unit 21*a* and the second light-emitting unit 21*b* are adjacently arranged along the first direction X, the first light-emitting unit 21*a* and the second light-emitting unit 21*b* are both arranged adjacent to the third light-emitting unit 21*c* along the second direction Y, and the first direction X crosses the second direction Y. The vertical orthographic projection of the cathode 31 on the base 10 covers the vertical orthographic projections of two adjacent pixel units 21 arranged along the first direction X on the base 10. The first light-emitting unit 21*a* is a red light-emitting unit or a green light-emitting unit, correspondingly, the second light-emitting unit 21*b* is a green light-emitting unit or a red light-emitting unit, and the third light-emitting unit 21*c* is a blue light-emitting unit. The area of the blue light-emitting unit is about twice that of the red light-emitting unit (or the green light-emitting unit), so that adjacent red light-emitting units and green light-emitting units may share one blue light-emitting unit.

As illustrated in FIG. 10, the first direction X is the width direction of the display panel, and the second direction Y is the length direction of the display panel. Preferably, the first direction X and the second direction Y are perpendicular to each other. Furthermore, the first direction X may also be the length direction of the display panel, and the second direction Y is the width direction of the display panel.

In the embodiment of the present disclosure, the cathode layer 30 includes the cathodes 31, the touch electrodes 32, the cathode bonding portions 311, and the touch bonding portions 321. The cathode bonding portions 311 are provided in a one-to-one correspondence with the cathodes 31, and the vertical orthographic projection of the cathode bonding portion 311 on the base 10 is located between the vertical orthographic projections of two adjacent third light-emitting units 21*c* on the base. The touch bonding portion 321 is disposed between two adjacent cathodes 31 arranged along the first direction X, and the vertical orthographic projection of the touch bonding portion 321 on the base 10 is located between vertical orthographic projections of two adjacent third light-emitting units 21*c* on the base. Each of the cathode bonding portions 311 and the touch bonding portions 321 is disposed between two adjacent third light-emitting units 21*c* arranged along the first direction X, and such a design is beneficial to avoid mutual interference between the touch signals and the display signals, and help to save layout space, so that the number of pixels per inch of the display screen is more, and the display quality is improved.

In the embodiment of the present disclosure, the plurality of touch bonding portions 321 are provided on the touch electrodes 32, and no touch bonding portions 321 are provided between some of the cathodes 31. Those skilled in the art may set the number and corresponding positions of the touch bonding portions 321 according to actual needs, and the present disclosure does not specifically limit the number and a general area of the touch bonding portions 321 in the array substrate.

Furthermore, the cathode bonding portion 311 is disposed on the cathode 31, and the touch bonding portion 321 is disposed on the touch electrode 32. Specifically, the cathode 31 is electrically connected to the metal wiring layer through the cathode bonding portion 311, and one cathode bonding portion 311 may provide voltage for the cathode 31 of at least two pixel units 21.

In the embodiment of the present disclosure, the materials of the cathode 31 and the touch electrode 32 both include magnesium-silver alloy, which is used to increase the conductivity of the cathode 31 and the touch electrode 32 and reduce the thickness of the cathode layer 30.

Figure 11:
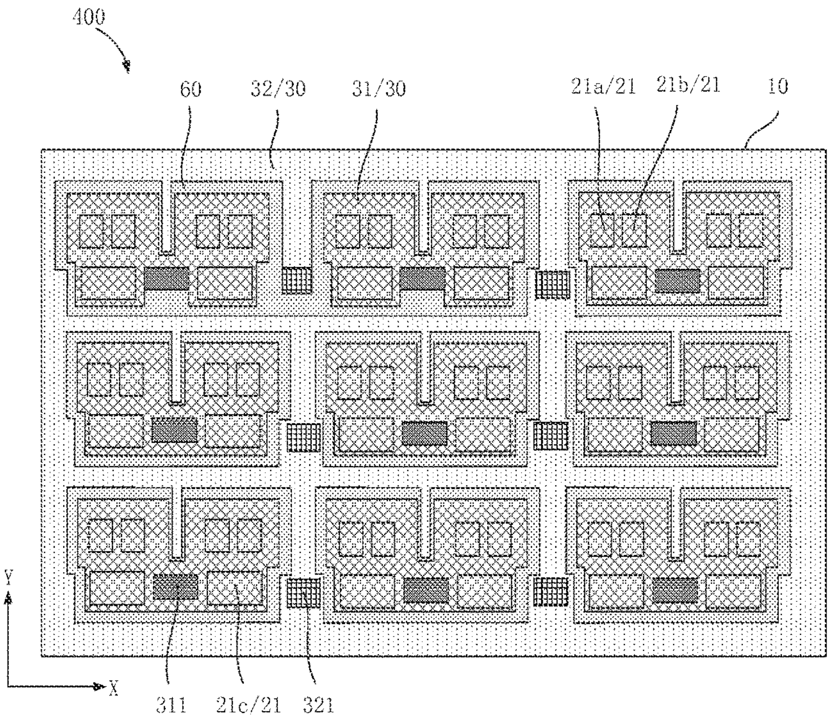
FIG. 11 is a schematic top view of an array substrate provided in a fourth embodiment of the present disclosure.

Referring to FIG. 11, array substrates 400 are provided in the fourth embodiment of the present disclosure, and the differences between the array substrate 400 and the array substrate 100 are that the cathode layer 30 includes the plurality of cathodes 31, and the touch bonding portion 321 is provided between every two adjacent cathodes 31, some of the touch bonding portions 321 are disposed on the hollow portions 60, and the hollow portion 60 is disposed between the cathode 31 and the touch electrode 32.

In the embodiment of the present disclosure, the pixel unit 21 includes the first light-emitting unit 21*a*, the second light-emitting unit 21*b*, and the third light-emitting unit 21*c*. The first light-emitting unit 21*a* and the second light-emitting unit 21*b* are adjacently arranged along the first direction X, the first light-emitting unit 21*a* and the second light-emitting unit 21*b* are both arranged adjacent to the third light-emitting unit 21*c* along the second direction Y, and the first direction X crosses the second direction Y. The vertical orthographic projection of the cathode 31 on the base 10 covers vertical orthographic projections of two adjacent pixel units 21 arranged along the first direction X on the base 10.

As illustrated in FIG. 11, the first direction X is the width direction of the display panel, and the second direction Y is the length direction of the display panel. Preferably, the first direction X and the second direction Y are perpendicular to each other. Furthermore, the first direction X may also be the length direction of the display panel, and the second direction Y is the width direction of the display panel.

In the embodiment of the present disclosure, the cathode layer 30 includes the cathodes 31, the touch electrodes 32, the cathode bonding portions 311, and the touch bonding portions 321. The cathode bonding portions 311 are provided in a one-to-one correspondence with the cathodes 31, and the vertical orthographic projection of the cathode bonding portion 311 on the base 10 is located between the vertical orthographic projections of two adjacent third light-emitting units 21*c* on the base. The touch bonding portion 321 is disposed between two adjacent cathodes 31 arranged along the first direction X, and the vertical orthographic projection of the touch bonding portion 321 on the base 10 is located between the vertical orthographic projections of two adjacent third light-emitting units 21*c* on the base. Each of the cathode bonding portions 311 and the touch bonding portions 321 is disposed between two adjacent third light-emitting units 21*c* arranged along the first direction X, and such a design is beneficial to avoid mutual interference between the touch signals and the display signals, and help to save layout space, so that the number of pixels per inch of the display screen is more, and the display quality is improved.

In the embodiment of the present disclosure, as illustrated in FIG. 11, the touch bonding portions 321 are provided between every two adjacent cathodes 31, some of the touch bonding portions 321 and some of the cathode bonding portions 311 are arranged on the hollow portions 60, and the hollow portion 60 is disposed between the cathode 31 and the touch electrode 32. Those skilled in the art may set the number and corresponding positions of the touch bonding portions 321 according to actual needs, and the present disclosure does not specifically limit the number and a general area of the touch bonding portions 321 in the array substrate.

Figure 12:
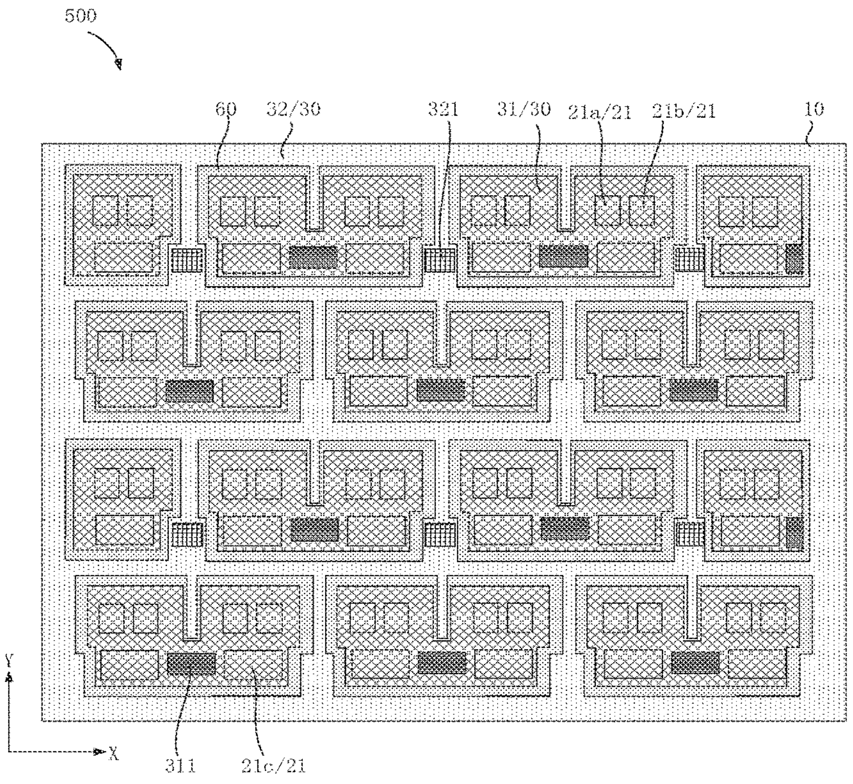
FIG. 12 is a schematic top view of an array substrate provided in a fifth embodiment of the present disclosure.

Referring to FIG. 12, array substrates 500 are provided in the fifth embodiment of the present disclosure, and the difference between the array substrate 500 and the array substrate 100 is that at least some of the cathode bonding portions 311 and the touch bonding portions 321 are alternately arranged along the second direction Y.

In the embodiment of the present disclosure, the pixel unit 21 includes the first light-emitting unit 21*a*, the second light-emitting unit 21*b*, and the third light-emitting unit 21*c*. The first light-emitting unit 21*a* and the second light-emitting unit 21*b* are adjacently arranged along the first direction X, the first light-emitting unit 21*a* and the second light-emitting unit 21*b* are both arranged adjacent to the third light-emitting unit 21*c* along the second direction Y, and the first direction X crosses the second direction Y. The vertical orthographic projection of the cathode 31 on the base 10 covers vertical orthographic projections of two adjacent pixel units 21 arranged along the first direction X on the base 10.

As illustrated in FIG. 12, the first direction X is the width direction of the display panel, and the second direction Y is the length direction of the display panel. Preferably, the first direction X and the second direction Y are perpendicular to each other. Furthermore, the first direction X may also be the length direction of the display panel, and the second direction Y is the width direction of the display panel.

In the embodiment of the present disclosure, the cathode layer 30 includes the cathodes 31, the touch electrodes 32, the cathode bonding portions 311, and the touch bonding portions 321. The cathode bonding portions 311 are provided in a one-to-one correspondence with the cathodes 31, and the vertical orthographic projection of the cathode bonding portion 311 on the base 10 is located between the vertical orthographic projections of two adjacent third light-emitting units 21*c* on the base. The touch bonding portion 321 is disposed between two adjacent cathodes 31 arranged along the first direction X, and the vertical orthographic projection of the touch bonding portion 321 on the base 10 is located between the vertical orthographic projections of two adjacent third light-emitting units 21*c* on the base. Each of the cathode bonding portions 311 and the touch bonding portions 321 is disposed between two adjacent third light-emitting units 21*c* arranged along the first direction X, and such a design is beneficial to avoid mutual interference between the touch signals and the display signals, and help to save layout space, so that the number of pixels per inch of the display screen is more, and the display quality is improved.

In the embodiment of the present disclosure, as illustrated in FIG. 12, some of the cathodes 31 are provided with one touch bonding portion 321 therebetween, and the touch bonding portions 321 and cathode bonding portions 311 are alternately arranged along the second direction Y. It should be noted that, when the pixel units 21 arranged along the second direction Y illustrated in FIG. 12 is defined as the pixel units 21 in a starting column, the pixel unit 21 in the starting column that does not share one cathode 31 with the adjacent pixel unit 21 in a second column and is provided with the cathode bonding portion 311 between it and the adjacent pixel unit 21 is removed or disconnected to the circuit, for example, the first pixel unit 21 in the first column and the first row in FIG. 12.

Specifically, the touch bonding portion 321 may also be provided between two adjacent cathodes 31 arranged along the first direction X. Those skilled in the art may set the number and corresponding positions of the touch bonding portions 321 according to actual needs, and the present disclosure does not specifically limit the number a general area of the touch bonding portions 321 in the array substrate.

Furthermore, the cathode bonding portion 311 is disposed on the cathode 31, and the touch bonding portion 321 is disposed on the touch electrode 32. Specifically, the cathode 31 is electrically connected to the metal wiring layer through the cathode bonding portion 311, and one cathode bonding portion 311 may provide voltage for the cathode 31 of at least two pixel units 21.

In the embodiment of the present disclosure, the materials of the cathode 31 and the touch electrode 32 both include magnesium-silver alloy, which is used to increase the conductivity of the cathode 31 and the touch electrode 32 and reduce the thickness of the cathode layer 30.

In another aspect, display panels are provided in the present disclosure. The display panel includes the above-mentioned array substrate. The display panels may be applied to mobile phones, tablet computers, TV sets, monitors, notebooks, computers, digital photo frames, navigators and any other products or components with display functions. For the implementation of the display panel, reference may be made to the above-mentioned embodiments of the array substrate, and repeated descriptions will not be repeated.

Array substrates and display panels are provided in the present disclosure. The array substrate includes the base 10, the intermediate layer 20, and the cathode layer 30. The intermediate layer 20 is arranged on the base 10 and includes a plurality of pixel units 21. The cathode layer 30 is arranged on the side of the intermediate layer 20 away from the base 10 and includes cathodes 31 and touch electrodes 32. The cathodes 31 are arranged corresponding to the pixel units 21, and the vertical orthographic projection of the cathode 31 on the base 10 covers vertical orthographic projection of at least two pixel units 21 on the base 10. The touch electrode 32 surrounds the cathode 31 and is spaced apart from the cathode 31. By arranging the cathode 31 and the touch electrode 32 on the same layer in the array substrate, mutual interference between the display signals and the touch signals may be avoided, and at the same time, the parasitic capacitance between the touch electrode 32 and the display signal line may be reduced, the quality of the display images and the touch precision are improved.

The above is a detailed introduction to the array substrates and the display panels provided in the embodiments of the present disclosure. In this paper, specific examples are used to illustrate the principles and implementation methods of the present disclosure. The descriptions of the above embodiments are only used to help understand the methods and core ideas of the present disclosure. At the same time, for those skilled in the art, based on the ideas of the present disclosure, there will be changes in specific implementation methods and application scopes. In summary, the contents of this specification should not be construed as limiting the present disclosure.

What is claimed is:

1. An array substrate, comprising:

a base;

an intermediate layer, disposed on the base and comprising a plurality of pixel units; and a cathode layer, disposed on a side of the intermediate layer away from the base, comprising touch electrodes, and comprising cathodes corresponding to the pixel units, wherein a vertical orthographic projection of each of the cathodes on the base covers vertical orthographic projections of two of the pixel units on the base, and each of the touch electrodes surrounds one of the cathodes and is spaced apart from the one of the cathodes;

wherein each of the pixel units comprises:

a first light-emitting unit and a second light-emitting unit arranged along a first direction; and a third light-emitting unit adjacently arranged to the first light-emitting unit and the second light-emitting unit along a second direction which crosses the first direction;

wherein the vertical orthographic projection of each of the cathodes on the base covers the vertical orthographic projections of the two of the pixel units, that are adjacent to each other along the first direction, on the base;

wherein the cathode layer further comprises:

cathode bonding portions, provided in one-to-one correspondence with the cathodes; and touch bonding portions, each arranged between two adjacent ones of the cathodes arranged along the first direction;

wherein a vertical orthographic projection of each of the cathode bonding portions on the base is located between vertical orthographic projections of two adjacent third light-emitting units arranged along the first direction on the base, and a vertical orthographic projection of each of the touch bonding portions on the base is located between vertical orthographic projections of another two adjacent third light-emitting units arranged along the first direction on the base; and wherein every two adjacent ones of the cathodes are provided with one of the touch bonding portions therebetween, some of the touch bonding portions are arranged on hollow portions, and each of the hollow portions is arranged between one of the cathodes and one of the touch electrodes.

2. The array substrate according to claim 1, wherein the cathode bonding portions are arranged on the cathodes, and the touch bonding portions are arranged on the touch electrodes.

3. The array substrate according to claim 1, wherein the cathode layer further comprises hollow portions disposed between the cathodes and the touch electrodes;

each of the hollow portions surrounds one of the cathodes and is surrounded by one of the touch electrodes; and some of the cathode bonding portions are arranged on the hollow portions and spaced apart from the touch electrodes.

4. The array substrate according to claim 1, wherein the cathode layer further comprises hollow portions disposed between the cathodes and the touch electrodes;

each of the hollow portions surrounds one of the cathodes and is surrounded by one of the touch electrodes; and some of the touch bonding portions are arranged on the hollow portions and spaced apart from the cathodes.

5. The array substrate according to claim 1, wherein the cathode layer further comprises hollow portions disposed between the cathodes and the touch electrodes;

each of the hollow portions surrounds one of the cathodes and is surrounded by one of the touch electrodes;

some of the cathode bonding portions are arranged on the hollow portions and spaced apart from the touch electrodes; and some of the touch bonding portions are arranged on the hollow portions and spaced apart from the cathodes.

6. The array substrate according to claim 1, wherein some of the cathodes are not provided with the touch bonding portions therebetween.

7. The array substrate according to claim 1, wherein some of the cathode bonding portions and some of the touch bonding portions are alternately arranged along the second direction.

8. The array substrate according to claim 1, wherein materials of the cathodes and the touch electrodes all comprise magnesium-silver alloy.

9. The array substrate according to claim 1, wherein the intermediate layer comprises an anode layer comprising anodes of the pixel units, and vertical orthographic projections of the touch electrodes on the base do not overlap with orthographic projections of the anodes on the base.

10. The array substrate according to claim 1, wherein a cross-sectional shape of each of the cathodes is a regular quadrilateral.

11. The array substrate according to claim 1, wherein a cross-sectional shape of each of the cathodes is an irregular polygon, and each of the cathodes correspondingly covers light-emitting units of the pixel units and covers a part of a gap between the pixel units.

12. A display panel, comprising an array substrate of claim 1.

13. An array substrate, comprising:

a base;

an intermediate layer, disposed on the base and comprising a plurality of pixel units; and a cathode layer, disposed on a side of the intermediate layer away from the base, comprising touch electrodes, and comprising cathodes corresponding to the pixel units, wherein a vertical orthographic projection of each of the cathodes on the base covers vertical orthographic projections of two corresponding ones of the pixel units on the base, and each of the touch electrodes surrounds a corresponding one of the cathodes and is spaced apart from the corresponding one of the cathodes;

wherein each of the pixel units comprises:

a first light-emitting unit and a second light-emitting unit arranged along a first direction; and a third light-emitting unit adjacently arranged to the first light-emitting unit and the second light-emitting unit along a second direction which crosses the first direction:

wherein the two corresponding one of the pixel units are adjacent to each other along the first direction;

wherein the cathode layer further comprises:

cathode bonding portions, provided in one-to-one correspondence with the cathodes; and touch bonding portions, each arranged between two adjacent ones of the cathodes arranged along the first direction;

wherein a vertical orthographic projection of each of the cathode bonding portions on the base is located between vertical orthographic projections of two corresponding third light-emitting units, that are adjacent to each other along the first direction, on the base; and wherein a vertical orthographic projection of each of the touch bonding portions on the base is located between vertical orthographic projections of two corresponding third light-emitting units, that are adjacent to each other along the first direction, on the base; and wherein every two adjacent ones of the cathodes are provided with a corresponding one of the touch bonding portions therebetween, some of the touch bonding portions are arranged on hollow portions, and each of the hollow portions is arranged between a corresponding one of the cathodes and a corresponding one of the touch electrodes.

14. The array substrate according to claim 13, wherein the cathode layer further comprises hollow portions disposed between the cathodes and the touch electrodes;

each of the hollow portions surrounds a corresponding one of the cathodes and is surrounded by a corresponding one of the touch electrodes; and some of the cathode bonding portions are arranged on the hollow portions and spaced apart from the touch electrodes, and/or some of the touch bonding portions are arranged on the hollow portions and spaced apart from the cathodes.

* * * * *